US009668365B2

(12) United States Patent
Fujikawa et al.

(10) Patent No.: US 9,668,365 B2
(45) Date of Patent: May 30, 2017

(54) LOCK STRUCTURE OF CIRCUIT BOARD UNIT

(71) Applicant: Azbil Corporation, Tokyo (JP)

(72) Inventors: Takeo Fujikawa, Tokyo (JP); Noriya Uchiumi, Tokyo (JP)

(73) Assignee: Azbil Corporation, Tokyo (JP)

( * ) Notice: Subject to any disclaimer, the term of this patent is extended or adjusted under 35 U.S.C. 154(b) by 0 days.

(21) Appl. No.: 15/165,325

(22) Filed: May 26, 2016

(65) Prior Publication Data

US 2016/0353589 A1    Dec. 1, 2016

(30) Foreign Application Priority Data

May 28, 2015 (JP) ................................ 2015-108817

(51) Int. Cl.
*H05K 5/00* (2006.01)
*H05K 5/02* (2006.01)
(Continued)

(52) U.S. Cl.
CPC ......... *H05K 5/0026* (2013.01); *H05K 5/0239* (2013.01); *H05K 5/0252* (2013.01); *H05K 7/14* (2013.01)

(58) Field of Classification Search
CPC ...... H05K 5/0239; H05K 5/0252; H05K 7/14; H05K 5/0026; H05K 7/1401; H05K 7/1487; H05K 5/0204; H05K 5/0217; H05K 7/1489; H05K 2201/09163; H05K 7/02; H05K 7/1488; H05K 7/18; G02B 6/3897; G02B 6/4452; G02B 6/445; H01R 31/06; H04Q 1/06; H04Q 1/13; H04Q 1/08; H04Q 1/023; H04Q 1/14; H04Q 2201/10;
(Continued)

(56) References Cited

U.S. PATENT DOCUMENTS 4,155,109 A * 5/1979 Finch ................... H05K 7/1408
361/679.4
5,162,980 A * 11/1992 Morgan ............... H05K 9/0062
174/382
(Continued)

FOREIGN PATENT DOCUMENTS

JP    H10-173370 A    6/1998

OTHER PUBLICATIONS

Japanese Application No. JP2015-108817 filed May 28, 2015.

*Primary Examiner* — Courtney Smith
*Assistant Examiner* — Michael Matey
(74) *Attorney, Agent, or Firm* — Amster, Rothstein & Ebenstein, LLP (57) ABSTRACT

In a circuit board unit storing circuit boards in a plurality of columns and rows, mounting and demounting of the circuit boards are locked without increasing an external shape of a product compared to a conventional configuration. Substrates are provided that have cut-away portions and a lock structure of a circuit board unit includes a slide portion that is formed of a frame member having openings arranged in a grid shape into which the circuit boards are able to be inserted and that is slidably mounted on a circuit board insertion surface of a front mask, and projection portions that are provided in the slide portion and are fitted into the cut-away portions of the circuit boards stored in a case when the slide portion is slid in one direction.

4 Claims, 14 Drawing Sheets

(51) Int. Cl.
*H05K 1/14* (2006.01)
*H05K 7/14* (2006.01)

(58) Field of Classification Search
CPC .......... H04Q 1/02; H04Q 1/025; H04Q 1/062; H04Q 1/064; H04Q 1/066; H04Q 1/068; H04Q 1/09; G06F 13/409; G06F 1/16; G06F 11/3031; G06F 11/3051; G06F 1/183

See application file for complete search history.

(56) References Cited

U.S. PATENT DOCUMENTS

| | | | | |
|---|---|---|---|---|
| 5,767,999 A * | 6/1998 | Kayner | ............... | G06F 13/409 398/164 |
| 6,128,196 A * | 10/2000 | Hoyle, Jr. | ............... | H05K 7/1439 206/454 |
| 6,166,917 A * | 12/2000 | Anderson | ............... | G06F 1/186 361/752 |
| 6,608,764 B2 * | 8/2003 | Clark | ............... | H01R 13/6658 361/752 |
| 7,140,885 B2 * | 11/2006 | Kitamura | ............... | H05K 5/0039 361/752 |
| 7,843,704 B2 * | 11/2010 | Chang | ............... | H05K 7/1461 361/741 |
| 8,325,487 B2 * | 12/2012 | Yamaguchi | ............... | H05K 7/1489 361/752 |
| 9,007,206 B2 * | 4/2015 | Chen | ............... | H04Q 1/13 340/540 |
| 9,577,383 B2 * | 2/2017 | Hammond, Jr. | ............... | H01R 13/719 |
| 2003/0076658 A1 * | 4/2003 | Aronson | ............... | G02B 6/4201 361/741 |
| 2003/0223209 A1 * | 12/2003 | Lee | ............... | H05K 9/0062 361/796 |
| 2005/0157474 A1 * | 7/2005 | Larson | ............... | H01R 13/6335 361/728 |
| 2007/0238367 A1 * | 10/2007 | Hammond, Jr. | ............... | H01R 13/719 439/676 |
| 2009/0194226 A1 * | 8/2009 | Tabet | ............... | H04Q 1/13 156/230 |
| 2010/0221954 A1 * | 9/2010 | Pepe | ............... | H01R 13/514 439/638 |
| 2011/0256742 A1 * | 10/2011 | Panella | ............... | H04L 41/12 439/65 |
| 2014/0125271 A1 * | 5/2014 | Wang | ............... | H02J 7/0027 320/107 |
| 2014/0141643 A1 * | 5/2014 | Panella | ............... | H04Q 1/13 439/391 |
| 2015/0009639 A1 * | 1/2015 | Papakos | ............... | H05K 7/1424 361/752 |

* cited by examiner

LOCK STRUCTURE OF CIRCUIT BOARD UNIT

CROSS-REFERENCE TO RELATED APPLICATION

The present application claims the benefit of and priority to Japanese Patent Application No. 2015-108817, filed on May 28, 2015, the entire contents of which are incorporated herein by reference.

TECHNICAL FIELD

The present invention relates to a lock structure of a circuit board unit in which circuit boards are detachably stored in a storage case.

BACKGROUND ART

In a panel instrument and the like in which modular components can be customized and added, in many cases, a circuit board is fixed to a resin holder in a snap-fit manner and the resin holder is coupled to a housing in a snap-fit manner. The snap-fit is one of the coupling techniques of two components and is commonly used.

On the other hand, in a case where the circuit board is to be detachably mounted, coupling in a snap-fit manner is not suitable. That is, in a case where the snap-fit is used as a mounting and demounting method, there is a concern that an excessive load is applied to a snap-fit portion and thereby destruction and fatigue failure of the snap-fit portion can occur, and a coupling function is lost.

With respect to this, conventionally, a lock structure is known which locks mounting and demounting of a plurality of circuit boards stored in a row within a housing (for example, see PTL 1). In the lock structure disclosed in PTL 1, a block-shaped lock member having grooves corresponding to storage clearances of the circuit boards is mounted on the housing to be slidable in an arrangement direction of the circuit boards. Then, in a state in which the lock member is slid in one direction and the grooves of the lock member are aligned with storage positions of the circuit boards (unlocked state), mounting and demounting of the circuit boards can be performed. In addition, in a state in which the lock member is slid in the other direction and the grooves of the lock member are shifted from the storage positions of the circuit boards (locked state), the circuit boards abut against the lock member and thereby mounting and demounting of the circuit boards is limited.

CITATION LIST

Patent Literature

[PTL 1] JP-A-10-173370

SUMMARY OF THE INVENTION

Problem that the Invention is to Solve

Here, in the conventional configuration disclosed in PTL 1, the lock member is configured to be thick and to maintain strength so that the circuit boards do not come off due to damage to the lock member even if the circuit boards are drawn in the locked state.

Thus, if the conventional configuration is applied to a circuit board unit in which the circuit boards are stored in a plurality of columns and rows, there is a problem that an external shape of a product is increased by a thickness of the lock member and space saving cannot be achieved. In addition, if the lock member is used, there is a problem that the lock member is an obstacle to a wiring operation of a connector to which the circuit board is connected and the appearance after wiring is also deteriorated.

The present invention is made to solve the problem described above and an object of the invention is to provide a lock structure of a circuit board unit in which mounting and demounting of circuit boards can be locked without increasing an external shape of a product compared to the conventional configuration in a circuit board unit in which circuit boards are stored in a plurality of columns and rows.

Means for Solving the Problem

According to the invention, there is provided a lock structure of a circuit board unit, in which circuit boards have cut-away portions, and in which the lock structure of a circuit board unit includes: a slide portion that is formed of a frame member having openings arranged in a grid shape into which the circuit boards are able to be inserted and that is slidably mounted on a circuit board insertion surface of a storage case; and projection portions that are provided in the slide portion and are fitted into the cut-away portions of the circuit boards stored in the storage case when the slide portion is slid in one direction.

Advantage of the Invention

According to the invention, with the configuration described above, mounting and demounting of the circuit boards can be locked without increasing an external shape of a product compared to the conventional configuration in a circuit board unit in which circuit boards are stored in a plurality of columns and rows.

BRIEF DESCRIPTION OF THE DRAWINGS

FIGS. 2A-2C are views illustrating the configuration example of the circuit board unit according to Embodiment 1 of the invention.

FIGS. 5A-5D are views illustrating the configuration example of the slide portion in Embodiment 1 of the invention, FIG. 5D is a top view.

FIGS. 6A and 6B are views describing assembling (mounting of the slide portion) of the circuit board unit according to Embodiment 1 of the invention.

FIGS. 8A and 8B are front views illustrating an operation of a lock structure of the circuit board unit according to Embodiment 1 of the invention.

FIGS. 9A and 9B are enlarged views illustrating a relationship between a cut-away portion and a projection portion of the circuit board unit according to Embodiment 1 of the invention.

FIGS. 10A and 10B are front views illustrating another configuration example of the circuit board unit according to Embodiment 1 of the invention.

MODE FOR CARRYING OUT THE INVENTION

Hereinafter, an embodiment of the invention will be described in detail with reference to the drawings.

Embodiment 1

FIGS. 1 and 2A-2C are views illustrating a configuration example of a circuit board unit according to Embodiment 1 of the invention.

As illustrated in FIGS. 1 and 2A-2C, the circuit board unit is a unit in which circuit boards 2 are detachably stored in a housing 1, circuit board storage portions 121 are provided in a grid shape, and the circuit boards 2 are able to be stored in a plurality of columns and rows. Here, as the circuit board unit, a controller will be described as an example. In addition, the circuit board storage portions 121 may be two or more columns and two or more rows, and in the illustrated example, a case of four columns and three rows is illustrated.

Figure 1:
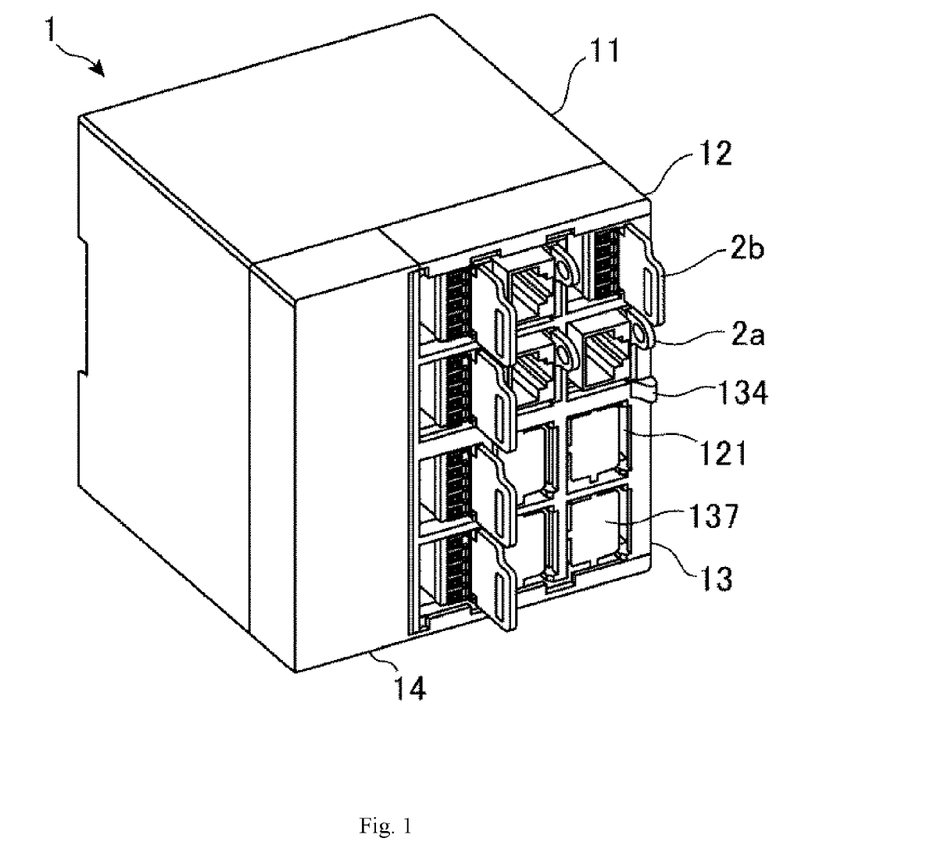
FIG. 1 is a perspective view illustrating a configuration example of a circuit board unit according to Embodiment 1 of the invention.
Figure 2A:
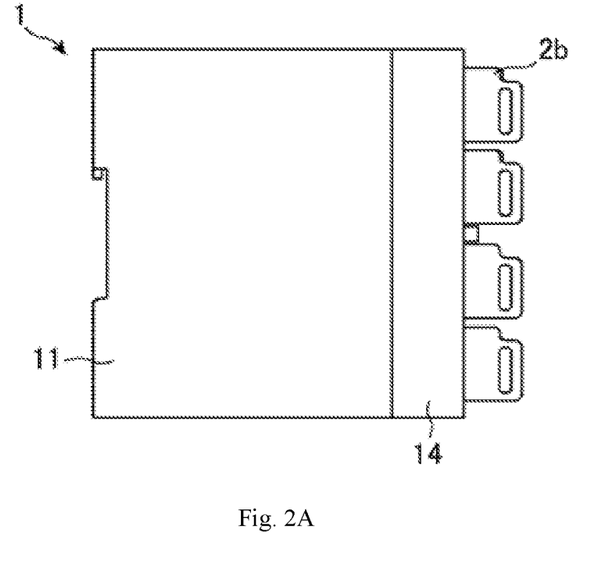
FIG. 2A is a left side view.
Figure 2B:
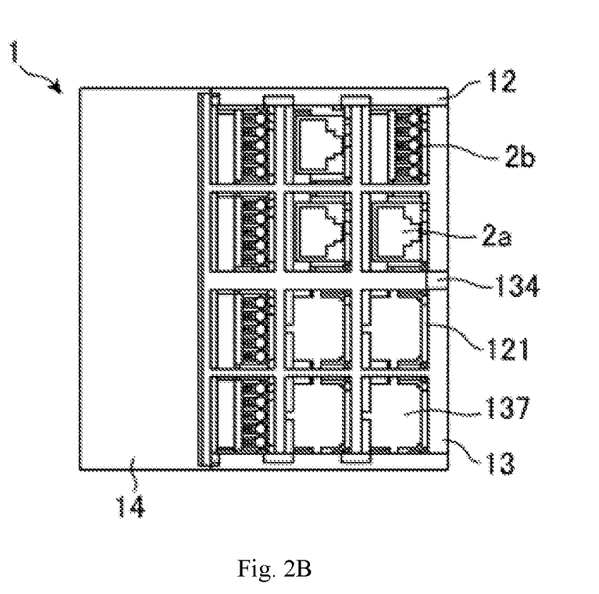
FIG. 2B is a front view.
Figure 2C:
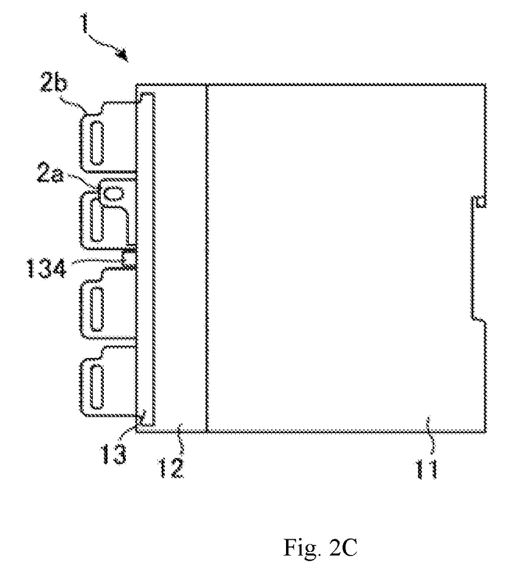
FIG. 2C is a right side view.
Figure 3:
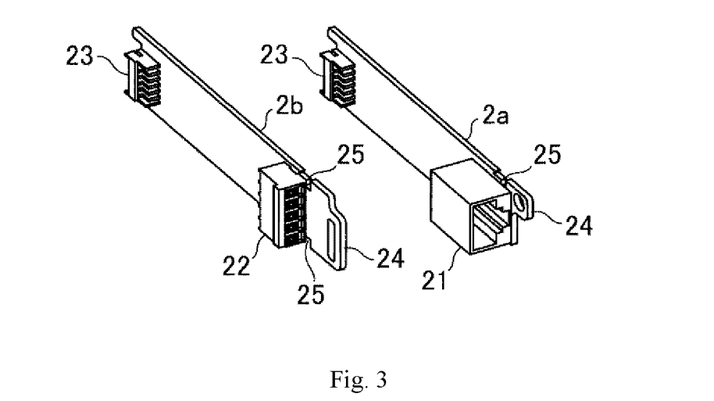
FIG. 3 is a perspective view illustrating a configuration example of circuit boards in Embodiment 1 of the invention.
Figure 4:
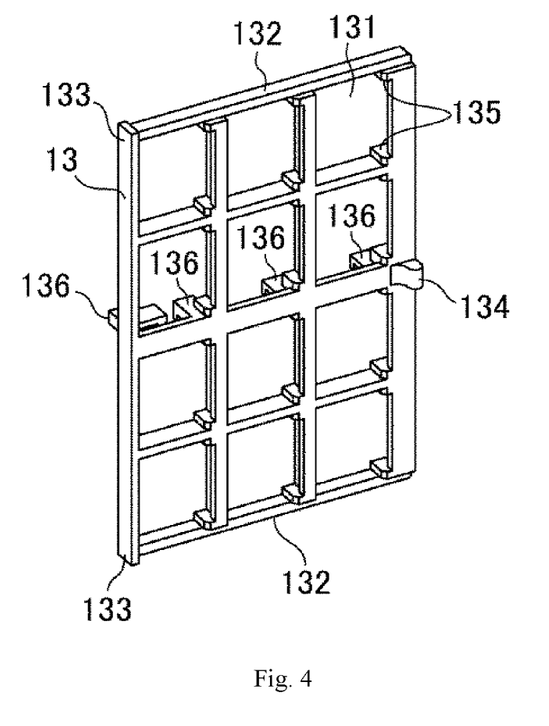
FIG. 4 is a perspective view illustrating a configuration example of a slide portion in Embodiment 1 of the invention.
Figure 5A:
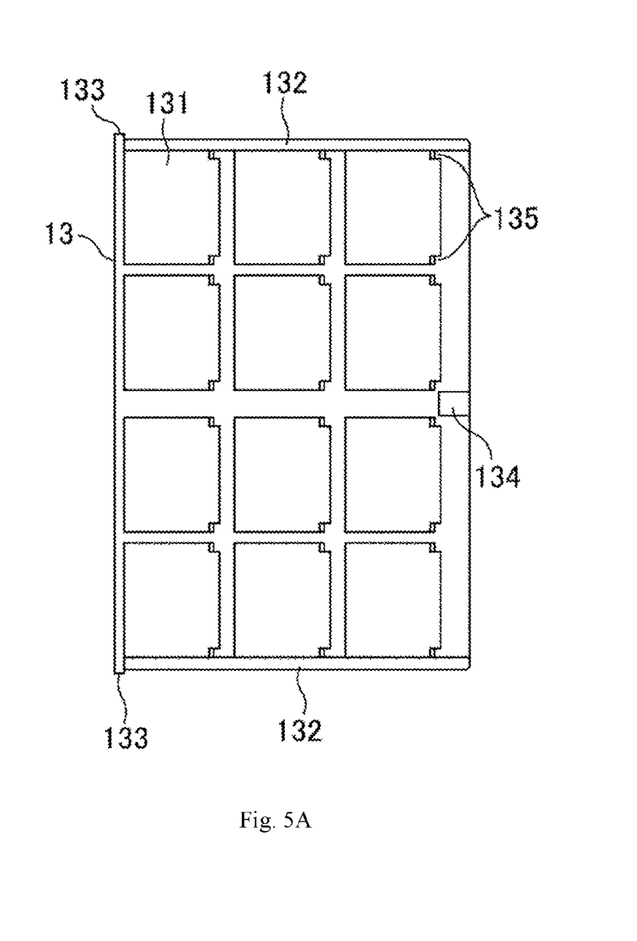
FIG. 5A is a front view.
Figure 5B:
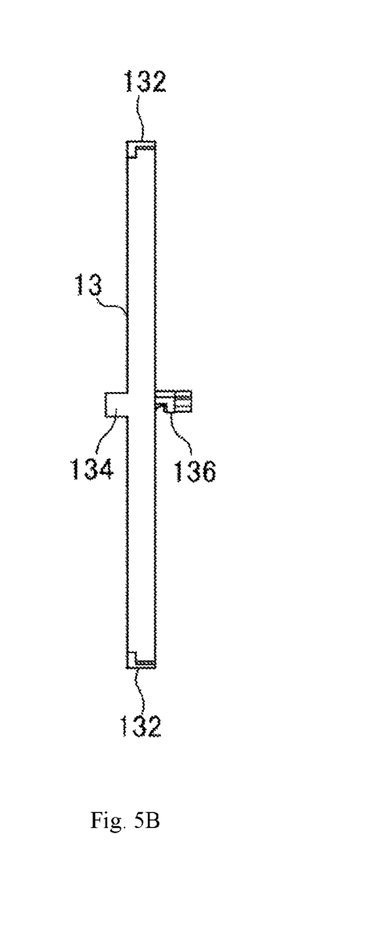
FIG. 5B is a right side view.
Figure 5C:
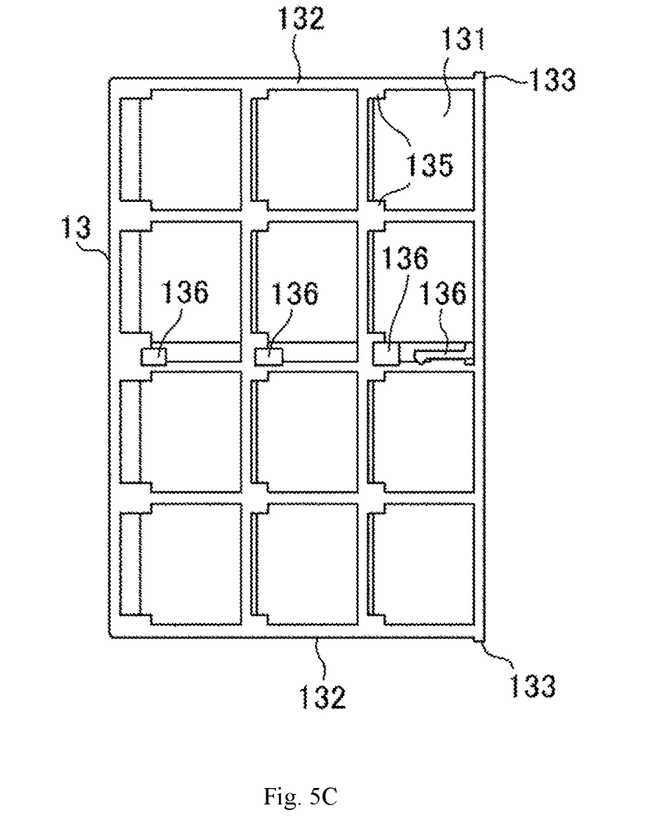
FIG. 5C is a rear view.
Figure 5D:
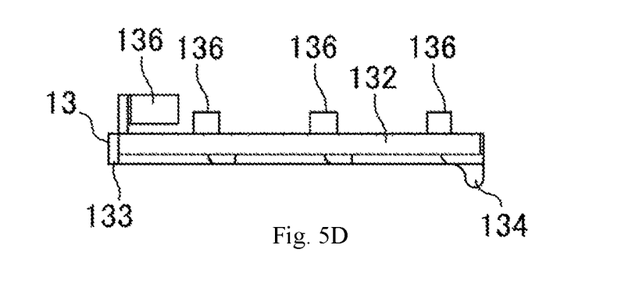

The circuit board 2 is used for realizing various functions of the controller and, for example, is configured as illustrated in FIG. 3. In the example of FIG. 3, a circuit board 2*a* having a connector 21 to which a LAN cable is connected on one end side and a circuit board 2*b* having a terminal 22 to which a terminal of a heater and the like is connected on one end side are illustrated. Connectors 23, which are connected to a main circuit board (not illustrated) disposed at a back within a case 11 of the housing 1 described later, are provided in the other ends of the circuit boards 2. In addition, a knob portion 24 that is pinched by an operator when the operator performs mounting and demounting of the circuit board 2 with respect to the housing 1 is provided in the one end of the circuit board 2. In addition, cut-away portions 25 are provided on the respective one end sides of the circuit boards 2. The cut-away portion 25 is a portion to which a projection portion 135 of a slide portion 13 (described below) of the housing 1 is fitted in a state in which the circuit board unit is in a locked state.

As illustrated in FIGS. 1 and 2A-2C, the housing 1 includes the case 11, a front mask 12, the slide portion 13, and a frame portion 14.

Figure 6A:
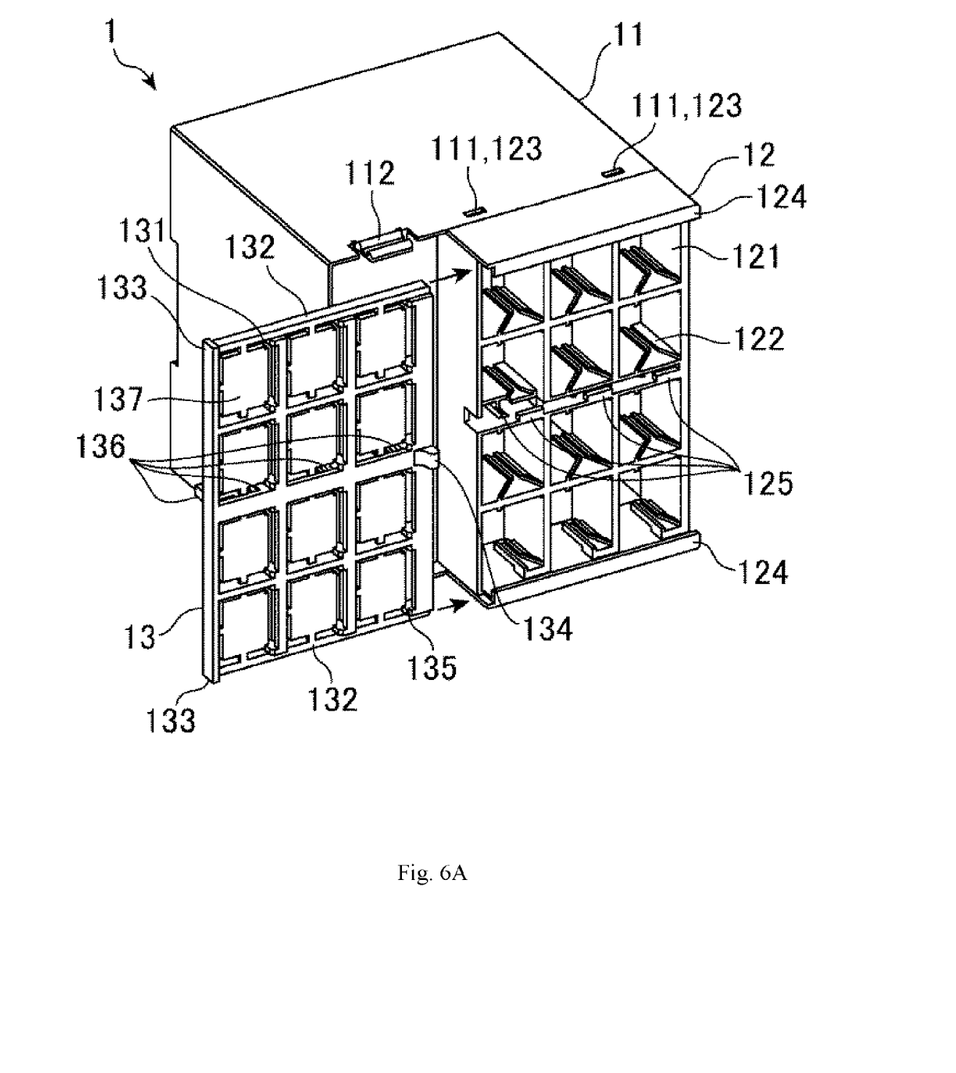
FIG. 6A is a perspective view.
Figure 6B:
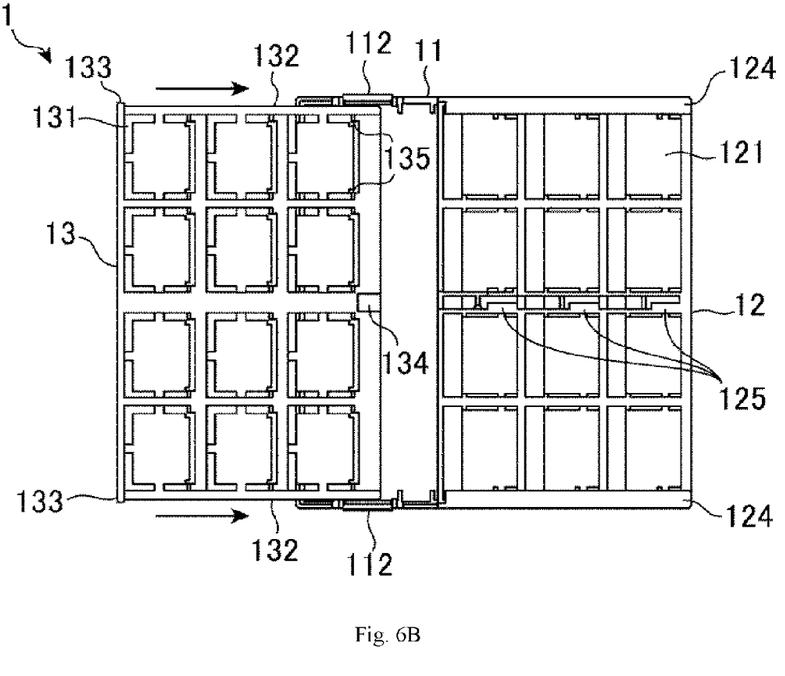
FIG. 6B is a front view.
Figure 7:
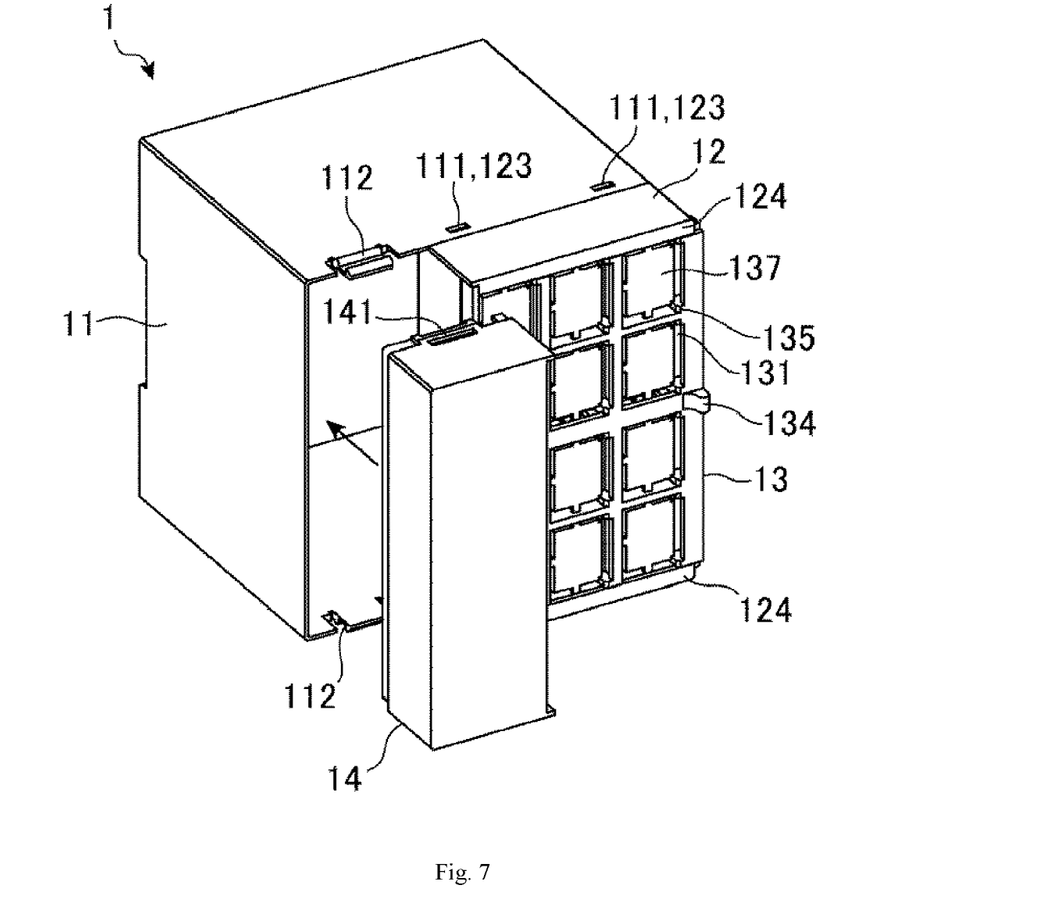
FIG. 7 is a perspective view describing assembling (mounting of a frame portion) of the circuit board unit according to Embodiment 1 of the invention.

The case 11 is provided for storing various circuit boards 2 and is a box-shaped member of which one surface is opened. The main circuit board is disposed in the back within the case 11. Then, a region (region on a right side in FIG. 1) of one side within the case 11 is a first storage region in which the circuit boards 2 are stored and the circuit boards 2 are connected to the main circuit board. In addition, a region (region on a left side in FIG. 1) of the other side within the case 11 is a second storage region in which circuit boards (not illustrated) that are unnecessary for mounting and demounting in principle such as a power supply circuit board are stored, and the circuit boards are connected to the main circuit board. In addition, as illustrated in FIGS. 6A, 6B, and 7, fixing portions 111 for fixing the front mask 12 on the first storage region side are provided on an opening end side of upper and lower surfaces of the case 11. Fixing portions 112 for fixing the frame portion 14 on the second storage region side are provided on the opening end side of the upper and lower surfaces of the case 11. Moreover, illustration of the fixing portions 111 and 112 is omitted in FIG. 1.

As illustrated in FIGS. 6A and 6B, the front mask 12 is a box-shaped member having the grid-shaped circuit board storage portions 121 configured of a front surface and a rear surface which are opened, and is mounted on an opening of the case 11 on the first storage region side. Guide rails 122 for guiding the circuit boards 2 to the main circuit board within the case 11 are provided in the circuit board storage portions 121. Moreover, illustration of the guide rails 122 is omitted in FIG. 6B. In addition, fixing portions 123 coupled to the fixing portions 111 of the case 11 are provided on the opening end side of the upper and lower surfaces of the front mask 12. The fixing portions 111 and the fixing portions 123 are configured of, for example, fixing claws and fixing grooves. Moreover, illustration of the fixing portions 123 is omitted in FIG. 1. In addition, slide rails 124 slidably holding slide bars 132 (described below) of the slide portion 13 in one direction are provided in a top and a bottom of the front mask 12. In addition, engaging portions (engaging portions on the case side) 125 engaged with engaging portions 136 (described below) of the slide portion 13 are provided at a center of the circuit board insertion surface of the front mask 12.

As illustrated in FIGS. 4 and 5A-5D, the slide portion 13 is a frame member having grid-shaped openings 131 into which the circuit boards 2 are able to be inserted and is slidably mounted on the circuit board insertion surface of the front mask 12. The slide bars 132, which are able to be slidable along the slide rails 124 of the front mask 12, are provided on both side surfaces (upper and lower side surfaces in the view) in a direction perpendicular to a slide direction in the slide portion 13. In addition, stopper portions 133, which limit sliding of the slide portion 13 by abutting against the side surface of the front mask 12 or the side surface of the frame portion 14, are provided in an end portion on a side opposite to the insertion side of the slide bars 132 into the slide rails 124. In addition, a knob portion 134 that is pinched by the operator when the operator slides the slide portion 13 is provided in the surface of the slide portion 13. In addition, the projection portion 135 is provided in each opening 131 of the slide portion 13. The projection portion 135 is a portion to which the cut-away portion 25 of the circuit board 2 is fitted in a state in which the circuit board unit is in the locked state. In addition, the engaging portions (engaging portions on the slide side) 136 engaged with the engaging portions 125 of the front mask 12 are provided at a center of a rear surface of the slide portion 13 in the direction perpendicular to the slide direction. In addition, as illustrated in FIGS. 6A, 6B, and 7, lid portions 137 for closing unused circuit board storage portions 121 of the front mask 12 are provided in the openings 131 of the slide portion 13. The lid portions 137 are easily detachably configured. Moreover, illustration of the lid portions 137 is omitted in FIGS. 4 and 5A-5D.

The frame portion 14 is a box-shaped member of which one surface is opened and is mounted on the opening of the case 11 on the second storage region side. The frame portion 14 covers the circuit boards that are unnecessary for mounting and demounting in principle such as the power supply circuit board stored in the case 11. In addition, as illustrated in FIG. 7, fixing portions 141 coupled to the fixing portions 112 of the case 11 are provided on the opening end side of the upper and lower surfaces of the frame portion 14. The fixing portions 112 and the fixing portions 141 are configured of, for example, fixing claws and fixing grooves. Moreover, illustration of the fixing portions 141 is omitted in FIG. 1.

Moreover, the case 11, the front mask 12, and the frame portion 14 configure the storage case of the invention.

Next, an assembly of the housing 1 of the circuit board unit of the invention will be described.

In the assembly of the housing 1, first, the front mask 12 is mounted on the first storage region side of the case 11. In this case, the fixing portions 123 of the front mask 12 are coupled to the fixing portions 111 of the case 11 and thereby the front mask 12 is firmly fixed to the case 11.

Next, as illustrated in FIGS. 6A and 6B, the slide portion 13 is mounted on the front mask 12. In this case, the operator slides the slide bars 132 of the slide portion 13 along the slide rails 124 of the front mask 12. Therefore, the engaging portions 136 of the slide portion 13 are engaged with the engaging portions 125 of the front mask 12. Then, the slide bars 132 are slid until the stopper portions 133 of the slide portion 13 abut against the side surface of the front mask 12 and thereby it is possible to mount the slide portion 13 on the front mask 12.

Next, as illustrated in FIG. 7, the frame portion 14 is mounted on the second storage region side of the case 11. In this case, the fixing portions 141 of the frame portion 14 are coupled to the fixing portions 112 of the case 11 and thereby the frame portion 14 is firmly fixed to the case 11. In addition, even if the slide portion 13 is slid on the frame portion 14 side, the stopper portions 133 abut against the side surface of the frame portion 14 due to mounting of the frame portion 14. Thus, the slide portion 13 is not disengaged from the front mask 12.

It is possible to assemble the housing 1 having the lock structure by the steps described above. Thereafter, the lid portions 137 of the slide portion 13 facing the circuit board storage portions 121 in which the circuit boards 2 are stored are detached and the circuit boards 2 are connected to the main circuit board within the case 11 via the slide portion 13 and the front mask 12.

Next, an operation example of the lock structure of the circuit board unit configured as described above will be described with reference to FIGS. 8A-8B and 9A-9B.

Figure 8A:
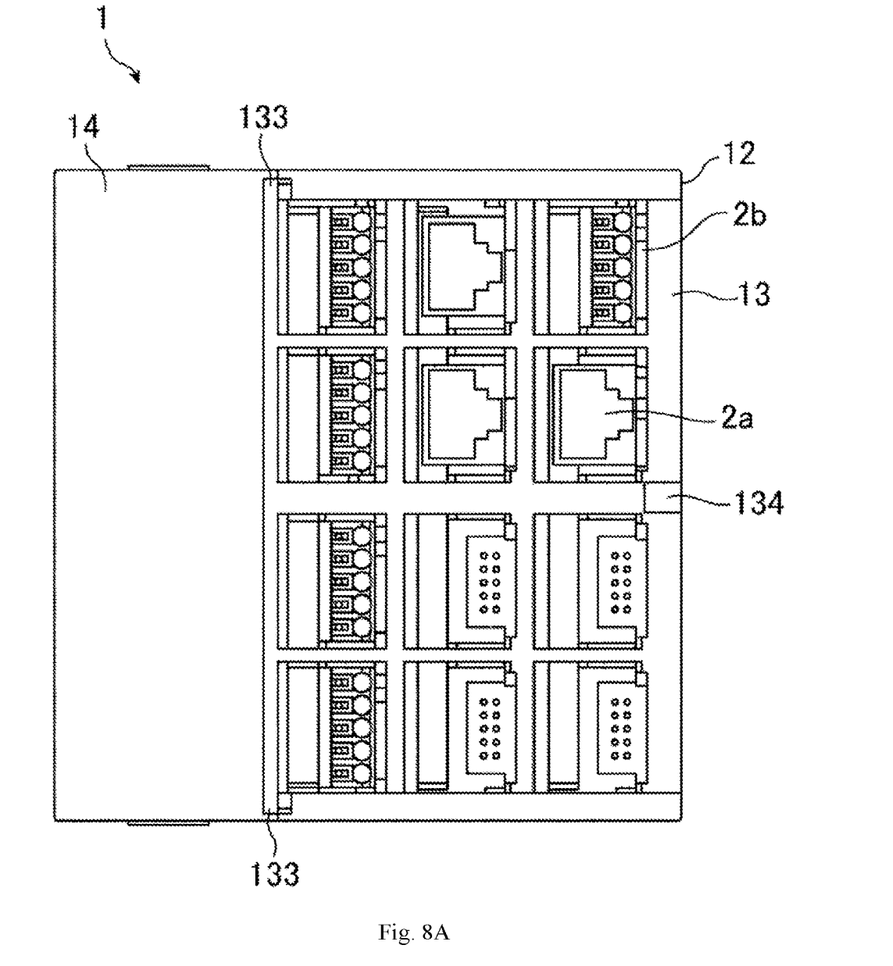
FIG. 8A is a view illustrating a locked state.
Figure 9A:
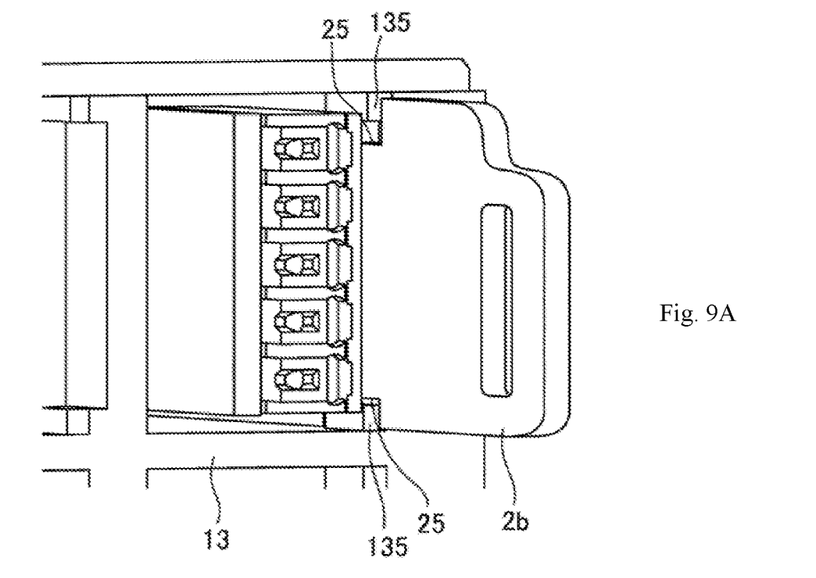
FIG. 9A is a view illustrating a locked state.

In the lock structure of the circuit board unit, as illustrated in FIGS. 8A and 9A, the operator pinches the knob portion 134 of the slide portion 13 and slides the slide portion 13 on the frame portion 14 side (left direction in the views), and thereby the projection portions 135 of the slide portion 13 are fitted into the cut-away portions 25 of the circuit boards 2. Therefore, mounting and demounting of the circuit boards 2 cannot be performed (locked state).

Figure 8B:
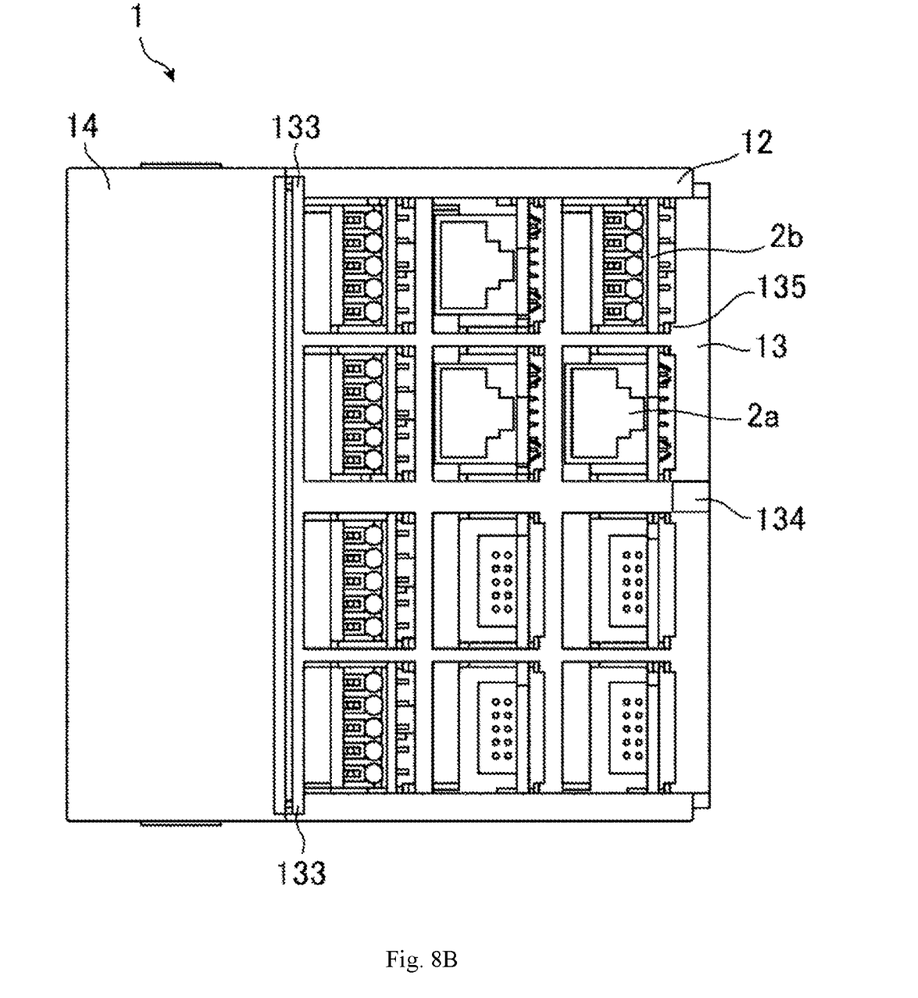
FIG. 8B is a view illustrating an unlocked state.
Figure 9B:
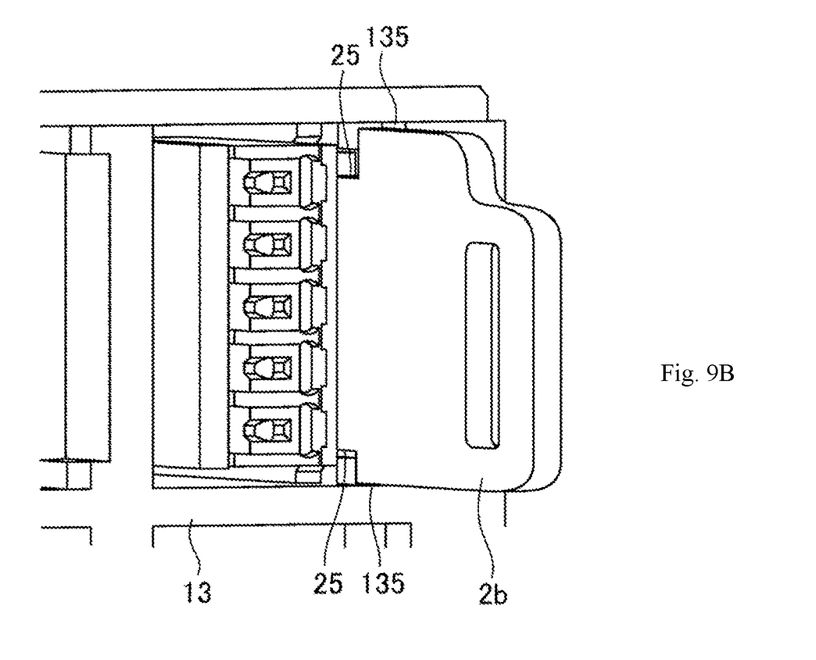
FIG. 9B is a view illustrating an unlocked state.

On the other hand, as illustrated in FIGS. 8B and 9B, the operator pinches the knob portion 134 of the slide portion 13 and slides the slide portion 13 on a side (right direction in the views) opposite to the frame portion 14, and thereby the projection portions 135 of the slide portion 13 are removed from the cut-away portions 25 of the circuit boards 2. Therefore, mounting and demounting of the circuit boards 2 can be performed (unlocked state). Thereafter, if the circuit board 2 is removed, the knob portion 24 of the circuit board 2 to be taken out is pinched and is pulled forward, and thereby the circuit board 2 can be easily taken out. In addition, if the circuit board 2 is mounted, the circuit board 2 is pushed to the back of the case 11 via the slide portion 13 and the front mask 12, and the connector 21 is connected to the main circuit board. Thereafter, the slide portion 13 is slid on the frame portion 14 side and thereby it becomes the locked state.

Moreover, in the invention, the slide portion 13 is configured of the frame member having the grid-shaped openings 131. Therefore, even if a block-shaped lock member as a conventional configuration is not used, it is possible to sufficiently secure the strength and to be thin in thickness by the frame member described above. As a result, in the circuit board unit in which the circuit boards 2 are stored in the plurality of columns and rows, it is possible to save space without increasing an external shape of a product.

In addition, in the above description, the engaging portions 125 and 136 engaging the center of the slide portion 13 and the center of the circuit board insertion surface of the front mask 12 are provided. That is, in the slide portion 13 formed of the frame member, the strength of the center portion is low, but it is possible to secure the strength in the center portion by the engaging portions 125 and 136 described above.

As described above, according to Embodiment 1, the circuit boards 2 have the cut-away portions 25, and the lock structure of the circuit board unit includes the slide portion 13 that is formed of the frame member having the grid-shaped openings 131 into which the circuit boards 2 are able to be inserted and is slidably mounted on the circuit board insertion surface of the front mask 12, and the projection portions 135 that are provided in the slide portion 13 and are fitted into the cut-away portions 25 of the circuit boards 2 stored in the case 11 when the slide portion 13 is slid in one direction. Thus, in the circuit board unit in which the circuit boards 2 are stored in the plurality of columns and rows, it is possible to lock mounting and demounting of the circuit boards 2 without increasing the external shape of the product compared to the conventional configuration. In addition, it is possible to simultaneously lock or unlock mounting and demounting of the plurality of circuit boards 2 stored in the housing 1. In addition, in the invention, the slide portion 13 can be thin in thickness by using the slide portion 13 formed of the frame member. Thus, wiring work with respect to the circuit board 2 is facilitated and it is possible to avoid damage of the appearance after wiring.

Figure 10A:
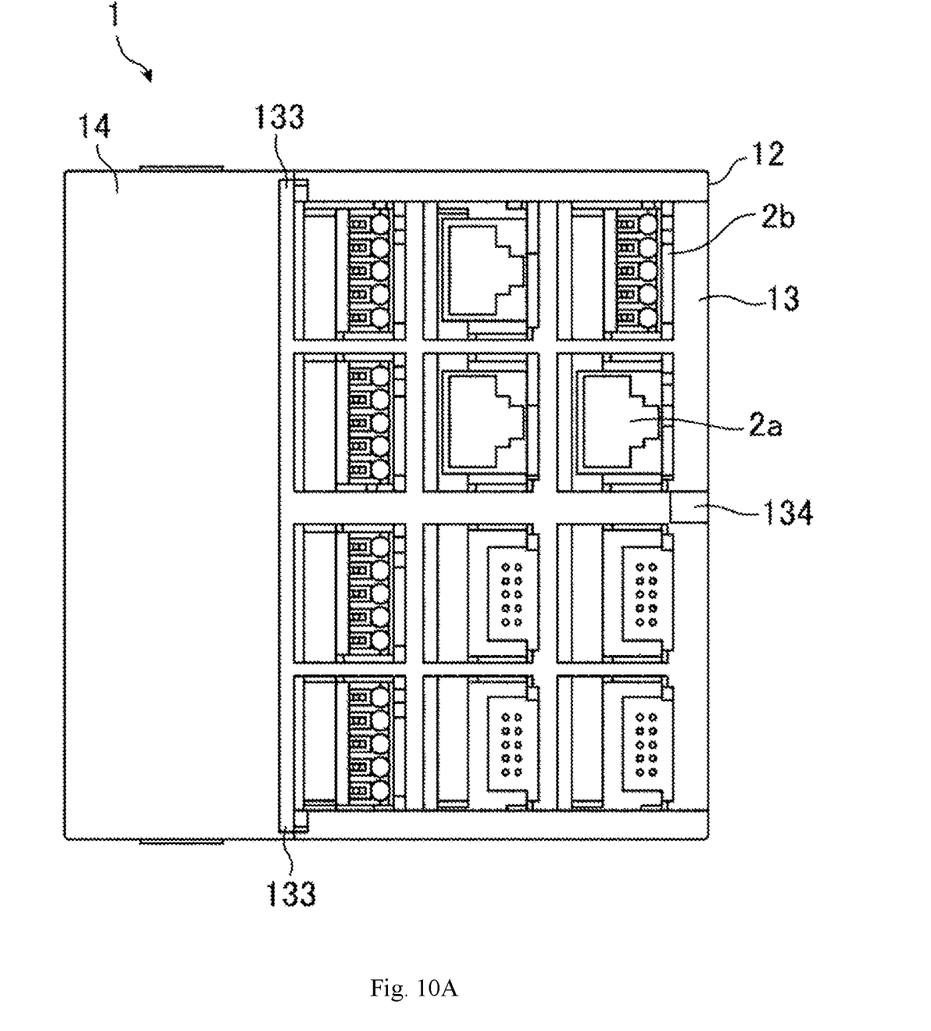
FIG. 10A is a view illustrating a locked state.
Figure 10B:
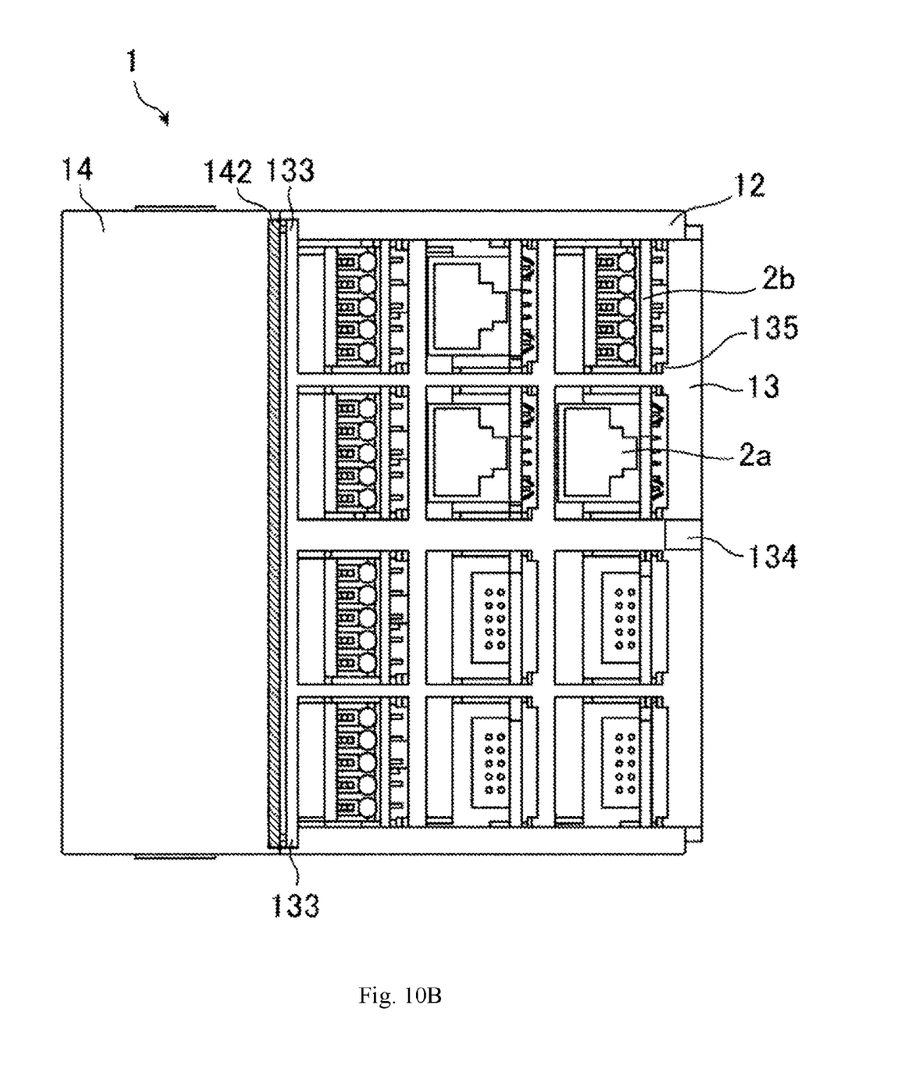
FIG. 10B is a view illustrating an unlocked state.

Moreover, for example, as illustrated in FIGS. 10A and 10B, a marker portion 142, which is visible in a state (unlocked state) in which the projection portions 135 are removed from the cut-away portions 25 of the circuit boards 2 stored in the housing 1, may be provided in the frame portion 14. The marker portion 142 has a color that is easily identified and different from a color of the housing 1. It is possible to easily recognize that the circuit board unit is in the unlocked state and to prevent forgetting of locking by the marker portion 142.

In addition, in the above description, a case in which the controller is used as the circuit board unit is illustrated. However, the invention is not limited to the description and is also equally applicable to another circuit board unit in which the circuit boards 2 are stored in the plurality of columns and rows.

In addition, in the invention, it is possible to deform arbitrarily configuration elements of the embodiment or to omit arbitrarily configuration elements of the embodiment within the scope of the invention.

DESCRIPTION OF REFERENCE NUMERALS AND SIGNS

1: housing
2: circuit board

11: case
12: front mask
13: slide portion
14: frame portion
21, 23: connector
22: terminal
24: knob portion
25: cut-away portion
111, 112: fixing portion
121: circuit board storage portion
122: guide rail
123: fixing portion
124: slide rail
125: engaging portion
131: opening
132: slide bar
133: stopper portion
134: knob portion
135: projection portion
136: engaging portion
137: lid portion
141: fixing portion
142: marker portion.

The invention claimed is:

1. A lock structure of a circuit board unit in which circuit boards are detachably stored in a storage case,
wherein the circuit boards comprise cut-away portions, and
wherein the lock structure of the circuit board unit comprises:
a slide portion that is comprised of a frame member having openings arranged in a grid shape into which the circuit boards are insertable and that is slidably mounted on a circuit board insertion surface of the storage case; and
projection portions that are provided in the slide portion and that are fitted into the cut-away portions of the circuit boards stored in the storage case when the slide portion is slid in one direction.

2. The lock structure of a circuit board unit according to claim 1, further comprising:
slide bars that are provided on both side surfaces of the slide portion in a direction perpendicular to a slide direction;
case-side engaging portions that are provided in a center of the slide portion in the direction perpendicular to the slide direction;
slide rails that are provided in the storage case and configured to slidably hold the slide bars; and
slide-side engaging portions that are provided in the storage case and that are configured to engage with the case-side engagement portions.

3. The lock structure of a circuit board unit according to claims 1 or 2, further comprising:
lid portions that are provided in the openings of the slide portion and are able to be detached.

4. The lock structure of a circuit board unit according to claims 1 or 2, further comprising:
a marker portion that is provided in the storage case and is viewable in a state in which the projection portions are disengaged from the cut-away portions of the circuit boards stored in the storage case.

\* \* \* \* \*